United States Patent
Joergensen et al.

(10) Patent No.: US 8,661,776 B2
(45) Date of Patent: Mar. 4, 2014

(54) LINK CHAIN WITH CHAIN JOINTS COATED WITH A HARD MATERIAL

(75) Inventors: Gerald Joergensen, Furstenfeldbruck (DE); Stefan Belmer, Anzing (DE)

(73) Assignee: IWIS Motorsysteme GmbH & Co., KG, Munich (DE)

( * ) Notice: Subject to any disclaimer, the term of this patent is extended or adjusted under 35 U.S.C. 154(b) by 0 days.

(21) Appl. No.: 13/605,179

(22) Filed: Sep. 6, 2012

(65) Prior Publication Data

US 2013/0086881 A1   Apr. 11, 2013

(30) Foreign Application Priority Data

Sep. 9, 2011 (EP) .................................. 11007363

(51) Int. Cl.
*F16G 13/04* (2006.01)
*B65G 17/38* (2006.01)

(52) U.S. Cl.
USPC ............ 59/35.1; 59/5; 59/8; 59/29; 59/78

(58) Field of Classification Search
USPC ........... 59/5, 8, 29, 30, 35.1, 78, 84; 474/206, 474/207, 212
See application file for complete search history.

(56) References Cited

U.S. PATENT DOCUMENTS

| | | | |
|---|---|---|---|
| 6,068,568 A * | 5/2000 | Kozakura et al. | 474/212 |
| 6,666,013 B2 * | 12/2003 | Nakagawa et al. | 474/206 |
| 7,490,715 B2 * | 2/2009 | Girg et al. | 59/5 |
| 7,730,710 B2 * | 6/2010 | Rejzner | 59/80 |
| 8,146,340 B2 * | 4/2012 | Shimada et al. | 59/5 |

FOREIGN PATENT DOCUMENTS

| | | |
|---|---|---|
| DE | 10 2006 052 869 A1 | 5/2008 |
| DE | 20 2006 020978 U1 | 5/2011 |
| EP | 1 219 861 A1 | 7/2002 |
| EP | 1 635 087 A1 | 3/2006 |
| EP | 1 980 642 A1 | 10/2008 |
| EP | 2 192 327 A1 | 6/2010 |
| WO | 02/40734 A1 | 5/2002 |

OTHER PUBLICATIONS

Search Report of corresponding European application No. 11007363.2 issued on Jan. 24, 2012.

* cited by examiner

*Primary Examiner* — David B Jones
(74) *Attorney, Agent, or Firm* — Baker & Hostetler LLP

(57) ABSTRACT

A link chain is made of chain links connected by chain joints, a chain joint comprising at least one bearing and a pin guided in a pivotable manner and in contact with this chain joint bearing. At least one bearing surface of the pin or chain joint bearing has a hard material layer applied by a PVD process, formed from a compound including at least two metals and a non-metal, at least C, N or Si being selected as the non-metal and the two metals being selected from Cr, Mo, W, Ti, Cu, Zn, Zr, Ta, Nb, Al, B, V, Hf, whereby the two metals differ from each other and the first metal is present in the hard material layer in a crystal structure that differs from the crystal structure of the second metal.

16 Claims, 3 Drawing Sheets

LINK CHAIN WITH CHAIN JOINTS COATED WITH A HARD MATERIAL

CROSS-REFERENCE TO RELATED APPLICATION

This application claims priority to foreign European Patent Application EP 11007363.2, filed on Sep. 9, 2011, the disclosure of which is incorporated herein by reference in its entirety.

FIELD OF THE INVENTION

The invention relates to a link chain made of chain links that are connected to one another by means of chain joints, whereby the chain joint comprises at least one chain joint bearing and a pin that is guided in the chain joint bearing in a pivotable manner and that is in contact with the chain joint bearing, whereby at least one bearing surface of the pin and/or of the chain joint bearing is provided with a hard material layer and the hard material layer is applied by means of a PVD process.

BACKGROUND

Link chains with chain links that are connected to one another by means of chain joints are in use in the state of the art in various forms. To a predominant extent, these are chains in which an inner chain link made of two parallel inner plates alternates with an outer chain link that consists of two outer plates connected to each other by means of two pins. A chain joint is thereby formed by means of a pin and the plates of the inner chain link which are pivotable on said pin. In the event that the chain has bushings, the chain joint is formed by the bushing and the pin fed through and held in a pivotable manner.

In use as driving chains or conveyor chains, particularly the area of the chain joint is highly loaded so that there is a great demand here with respect to a wear-resistant bearing surface. In addition to the use as driving chains or conveyor chains, link chains are again increasingly being used in the automotive industry for controlling the valve operating mechanism of internal combustion engines. The requirements on the wear resistance are thereby particularly high, because in internal combustion engines there are very frequent load-cycle changes and only very restricted access for maintenance or replacement of the chain. Moreover, there is an endeavour to design the chain so that it is as small and has as little weight as possible, which further increases the load on the individual chain elements.

In order to achieve the necessary wear resistance and to avoid elongation caused by wear, the pins and/or bushings of conventional link chains are subjected to heat treatment, e.g., hardening and tempering, carbonisation, carbonitriding, etc., or they are provided with a carbide layer. In spite of heat treatment of the joint components and/or the formation of a carbide layer on the joint surfaces, wear problems and elongation caused by wear occur, particularly in the use as timing chains in an internal combustion engine, that reduce the engine's reliability or necessitate an expensive exchange of the chain.

A link chain of this category is known from DE 10 2006 052 869 A1. In this, a link chain is disclosed whose pin and/or bushing is provided with a PVD hard material layer, whereby the pin and/or the bushing consists of a base material made of a high carbon steel with a carbon content between 0.4 weight % and 1.2 weight % that supports the PVD hard material layer. The disclosed PVD hard material layer can consist both of metal hard materials and of non-metal hard materials. All carbides, nitrides, carbonitrides, borides, and silicides of the transition metals come into question as metal hard materials. Coming into question as non-metal hard materials are, for example, diamond and DLC (diamond-like carbon), as well as corundum, boron carbide, cubic boron nitride, silicon carbide or aluminium nitride.

Such hard material layers represent an improvement over the previously used coating methods. Nevertheless, due to the aforementioned high loads and the trend towards smaller dimensioning of engines with simultaneous power increase, there is a demand for chains capable of bearing even greater loads.

PVD methods furthermore have the problem that the coating material deposits not only on the objects to be coated, but also in the coating system. In the case of the PVD method (Physical Vapour Deposition), so-called targets are used that consist of the material that is to be deposited on the component to be coated. By means of different methods, it is possible to separate the coating material from this target so that it arrives as a gaseous particle flow on the surface of the component to be coated and forms a coating. Here it is wished, on the one hand, that the targets consist only of the elements that later should also be deposited on the end product. Moreover, one objective is to keep the material combinations that later are deposited on the end product at a low number. This simplifies the assembly or production of the targets and consequently also minimizes the complexity of the unwanted contamination of the coating chamber.

SUMMARY OF THE INVENTION

It is therefore the object of the invention to enhance a link chain with respect to its wear characteristics and additionally to state a coating method that is improved with respect to previous coating methods.

The object is solved with a link chain made of chain links that are connected to one another by means of chain joints, whereby a chain joint comprises at least one chain joint bearing and a pin that is guided in the chain joint bearing in such a manner that it can pivot and that is in contact with this chain joint bearing, wherein at least one bearing surface of the pin and/or of the chain joint bearing is provided with a hard material layer and the hard material layer is applied by means of a PVD process, wherein the hard material layer is formed from a compound that comprises at least a first and a second metal and a non-metal, wherein selected as the non-metal is at least one of the materials C, N or Si and the first metal and the second metal are selected from the materials Cr, Mo, V, W, Ti, Cu, Zn, Zr, Ta, Nb, Al, B, Hf, wherein the first and the second metal differ from each other, and the first metal is present in the hard material layer in a crystal structure that differs from the crystal structure of the second metal.

The object is also solved with a method for coating a bearing surface by coating with a hard material layer a bearing surface of a pin and/or of a chain joint bearing for a chain, wherein the hard material layer is applied by means of a PVD process and is formed from a compound that comprises at least a first and a second metal and a non-metal, wherein at least one of the materials C, N or Si is selected as the non-metal and the first metal and second metal are selected from the materials Cr, Mo, W, Ti, Cu, Zn, Zr, Ta, Nb, Al, B, V, Hf, wherein the first metal and the second metal differ from each other, and the first metal is present in the hard material layer in a crystal structure that differs from the crystal structure of the second metal.

The pin forms a friction pairing with the chain joint bearing. To reduce the friction in the chain joint bearing with the help of the hard material layer, it is sufficient if one of the two elements, i.e., the pin or the chain joint bearing, is provided with the hard material layer. Both could likewise also be coated. The hard material layer consists of a compound that comprises at least three materials. These are a first and a second metal, as well as a non-metal. The non-metal is selected from the group of carbon (C), nitrogen (N) or silicon (Si). The first metal and the second metal are selected from the materials chromium (Cr), molybdenum (Mo), vanadium (V), tungsten (W), titanium (Ti), copper (Cu), zinc (Zn), zirconium (Zr), tantalum (Ta), niobium (Nb), aluminium (Al), boron (B) and hafnium (Hf).

The first metal and the second metal thereby differ from each other. The first and the second metal form crystalline structures in the hard material layer. The first metal and the second metal are thereby selected in such a way that these have crystal structures that differ in the hard material layer in combination with the non-metal. Known as typical crystal structures for metals are the face-centred cubic crystal structure (fcc), the hexagonal crystal structure (hex) and the tetragonal crystal structure (tetr).

It has been seen that such combinations of a non-metal with two metals, each with a different crystal structure, lead to a layer with a very high level of hardness. This can be attributed to the fact that no homogenous layer composition results, and instead there are individual defects in the layer configuration, as a result of which a so-called crystal mismatch exists with a hardening increase and/or grain refinement. The result is consequently a generation of alternating combinations of crystal structures of the individual material phases in the layer: e.g., cubic with hexagonal or tetragonal structures, body-centred cubic with face-centred cubic structures.

Alternatively, it can be provided that one of the non-metals carbon, nitrogen or silicon is the significant reactant. This can be controlled by means of the provision of the respective quantity of a material.

Furthermore it can be provided that the hard material layer has a gradated configuration with respect to the non-metal portion, the hardness or the internal stress portion. The term "gradated" is thereby to be understood such that it does more than just indicate the configuration of a coating of different layers that can be delimited from one another. There can also be a material-related non-uniform distribution present within a layer. Furthermore a gradated layer is conceivable into which a further layer is inserted, i.e., the gradation extends across the entire coating, but is, however, interrupted by a second layer. It is furthermore conceivable that a gradated layer in the coating is covered with a second layer of the second metal, whereupon a new independently gradated layer of the first metal is then again attached. As already addressed, the gradation can also have an influence with regard to the hardness or the internal stress portion. This means that the hardness level in the hard material layer has different values depending on the location.

It is furthermore conceivable that a Cr-alloy steel, e.g., 59CrV4 or 100Cr6, is selected as the base material of the pin or of the chain joint bearing. These metals have proven to be a good basis for such coatings.

One conceivable development of the link chain consists of choosing the layer thickness of the hard material layer in the range from 1 to 15 µm, preferably 1 to 10 µm. Such a layer thickness offers a sufficient protective layer in the event of long-term loading and is not too thin.

It can furthermore be provided that a sub-layer thickness of the hard material layer amounts to less than 1 µm, preferably less than 0.5 µm. Provided the hard material layer consequently is formed from individual sub-layers that can be distinguished from one another, these should amount to less than 1 µm, preferably less than 0.5 µm. In this way, it is ensured that a detachment or flaking off of individual layers is prevented.

In addition, it is conceivable that the gradated particle sizes of the hard material layer have a size of less than or equal to 100 nm, preferably of less than or equal to 50 nm. Provided that individual particle sizes are discernible in the hard material layer, these size ranges have proven to be preferred for the hardness and fatigue resistance of the hard material layer.

In addition, it is conceivable that the hard material layer has, at least in areas, a glass-like structure. To be understood as glass-like is thereby that the atoms do not form ordered structures, but instead form an irregular pattern and have only a short-range order, not a long-range order. Such glass-like structures, which are assembled from the materials used for the hard material layer, have a high level of stability as well as fatigue resistance and are thereby one of the aimed-at developments.

Alternatively, it can be provided that the gradated layer hardness levels of the hard material layer are from 2000 to 4000 HV or 4000 to 7000 HV. These ranges of the layer hardness levels are preferred in the normally occurring usage conditions for such link chains.

In addition, it is conceivable that the hard material layer is applied by means of a continuous PVD method using a through-feed method. Through-feed methods differ from batch methods in that the components to be coated are introduced to and removed from the coating chamber continuously, e.g., by means of a conveyor belt. There are consequently constantly components in the coating chamber, whereby the components are in different stages of the coating process. In batch methods, on the other hand, a certain number of components are together introduced into the chamber and removed from it again after the coating. There are therefore time periods in which there are no components in the coating chamber. In the case of batch methods, all components are additionally always in the same stage of the coating process. The through-feed method allows a significantly higher throughput and is therefore to be preferred for economic reasons.

The object according to the invention is additionally solved by a chain pin for a link chain, whereby the chain pin is provided, at least in areas, with a hard material layer of the type previously presented.

In addition, the object according to the invention is solved by a method for coating with a hard material layer a bearing surface of a pin and/or of a chain joint bearing for a chain, whereby the hard material layer is applied by means of a PVD process and is formed from a compound that comprises at least a first and a second metal and a non-metal, whereby selected as the non-metal is at least one of the materials carbon, nitrogen or silicon and whereby the first metal and the second metal are selected from the materials chromium, molybdenum, tungsten, copper, zinc, zirconium, tantalum, niobium, aluminium, boron, vanadium and hafnium, whereby the first and the second metal differ from each other, and the first metal, in combination with the non-metal, forms in the hard material layer a crystal structure that differs from the crystal structure of the second metal in combination with the non-metal.

Alternatively, it can be provided that the hard material layer is applied in a gradated configuration.

In addition, it can be provided that the PVD process runs as a continuous process in the through-feed method.

In addition, it can be provided that the components that are to be coated are fed during the coating process in a coating area in such a way that these are exposed at least in areas to different temperatures over time. In addition to the selection of the correct material combinations, the variation of the temperatures can also, to a certain extent, be used in order to support the formation of different crystal structures. The coating method is therefore adapted in such a way that even in the case of an assumed constant infeed of the individual materials, different crystal structures nevertheless form due to the variation in the temperature.

As a further variant, it can be provided that the first metal is selected from a first group and the second metal is selected from a second group, whereby at least one metal of the first group is combined with at least one metal of the second group, and whereby the first group includes chromium, molybdenum, vanadium, tungsten, and titanium and the second group includes copper, zinc, zirconium, tantalum, niobium, aluminium, boron and hafnium.

BRIEF DESCRIPTION OF THE DRAWINGS

In the following, the invention is described in more detail on the basis of the drawings. Shown are.

DETAILED DESCRIPTION

Figure 1:
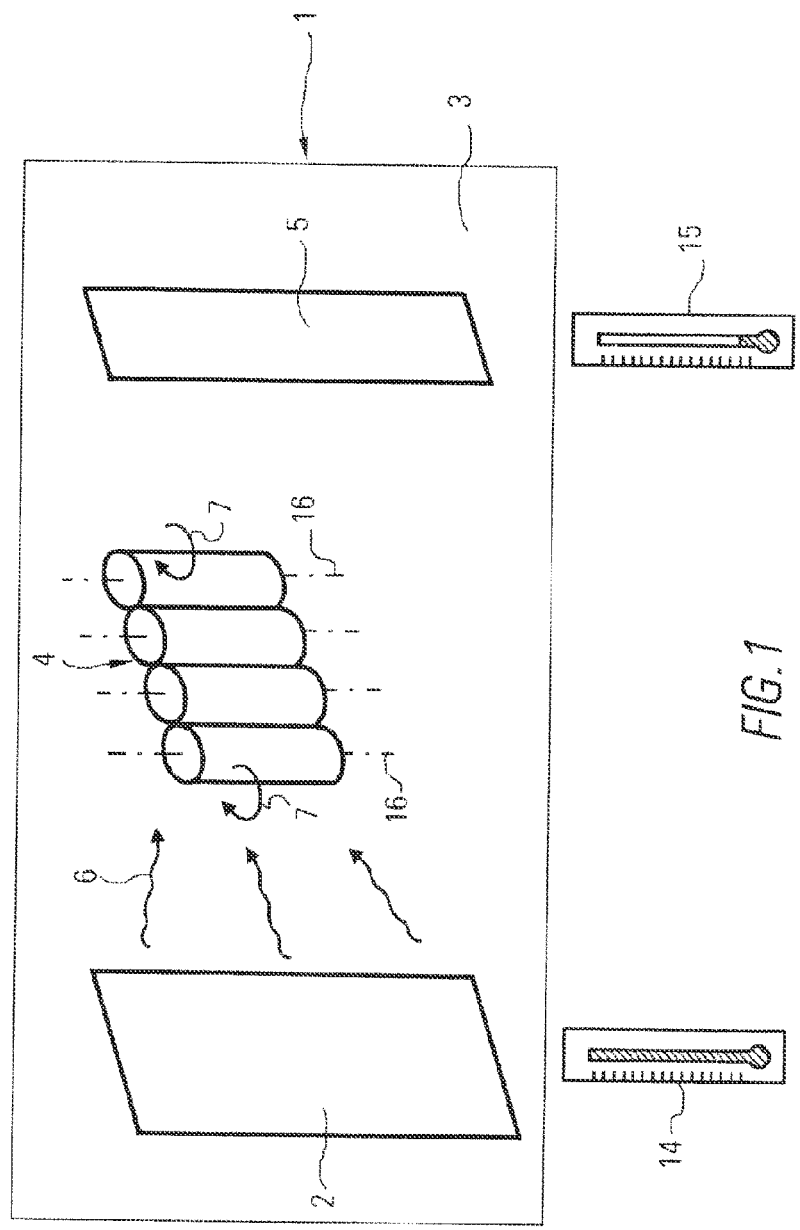
FIG. 1 a greatly schematised sketch of a coating device,
FIG. 2 a greatly schematised schematic diagram of the coating method,
FIG. 3 a schematic depiction of a ternary phase diagram.
Figure 2:
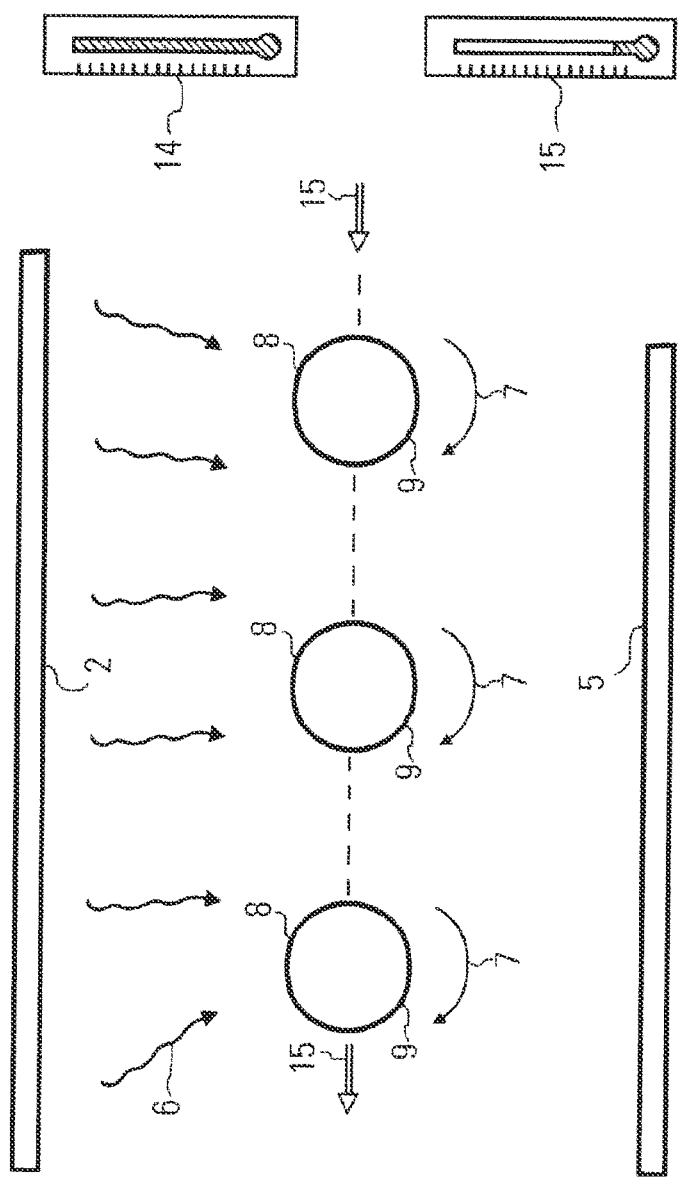

The desired hardness of the hard material layer is achieved by means of the mixture of a non-metal with two different metals, whereby the metals differ substantially in their crystallisation structure. This means that given equal activation conditions, for example, a plasma, and given the same reactive gas compositions, the two metals form different crystal lattices. This results in a crystal mismatch with miscibility gaps, as a result of which hardening mechanisms take effect that increase the hardness of the hard material layer. Furthermore there results extreme grain refinement and a superficial friction reduction. The hard material layer according to the invention therefore has, on the one hand, hardness that is better than the hard material layers known until now and additionally reduced friction on its surface. The hard material layer is correspondingly very wear-resistant and furthermore has very good friction coefficients.

A further effect that results is a tribochemical lubricating effect of the coating materials under the operating conditions of a combustion engine. This means that the hard material layer according to the invention works optimally together with the motor oil or the additives in the motor oil in order to reduce the friction in the chain joint.

The crystal structures achieved in the hard material layer significantly depend on the ionic sizes of the selected materials. This ionic radius is fundamentally not dependent on the substance or material, but instead depends on the process. The ionic radius results from the ionisation degree of the material, whereby the relationship between the ionic radii of the materials determines the crystal structure (e.g., cubic, hexagonal, tetragonal) by way of the threshold radius base $r+/r-$. In order to achieve the hardest possible and most resistant possible hard material layer, the objective here is always to pair different crystal structures with one another. Consequently, for $r+/r-$ between 1 and 0.73, crystal structures in the cubic development arise, to 0.41 octahedral and for $r+/r-$ to 0.2, crystal structures in the tetrahedral development. Examples of possible material combinations are:

(V,Ta)C (V,Nb)C (V,Hf)C (Cr,Zr)N (Cr,Mo)N (Cr,W)N (Cr,Cu)N (Mo,Cu)N (W,Cu)N (Mo,V)N (Cr,V)N (V,Nb)N (Ti,Nb)N

The cited material combinations can be present as variants with C, Cn, SiN or SiC. The order of the materials and the proportions of the two metals are fundamentally exchangeable.

Depending on the proportion of the first metal to the second metal, the metal present in the greater quantity dominates the primary structure, i.e., a change in the dominant metal can be provided for gradation.

Furthermore, the following phases are conceivable in the layers (only a collection of examples):

$CrN_{1-x}$—$MoN_{1-y}$—$Si_aN_b$ $CrN_{1-x}$—$WN_{1-y}$ $CrCN_{1-x}$—$WCN_{1-y}$ $CrN_{1-x}$—$MoN_{1-y}$—SiC $MoN_{1-x}$—$CuN_{1-y}$ $CrN_{1-x}$—$CuN_{1-y}$ $CrN_{1-x}$—$ZrCN_{1-y}$ $ZrN_{1-x}$—$CuN_{1-y}$ $MoCu$—$MoN_{1-x}$

These layers can be formed as gradient layers and/or multi-layer layers and/or nano-composition layers. A multi-layer layer is thereby to be understood as the provision of a plurality of layers that are constructed from different material combinations. In addition, gradient layers or a mixture thereof can likewise be provided, whereby the layer composition changes only gradually and no clear delimitation can be brought about between different layers. To be understood as a nano-composite layer is a layer whose structure is formed from a primary material by means of introducing one or more materials in a low quantity. For example, a nano-composite layer could be formed from CrN—MoN—SiN, whereby SiN forms the basic structure or the matrix, and CrN and MoN are incorporated in a low quantity, preferably as nano-particles.

Furthermore, due to the application of the hard material layer and its characteristics, the surface of the hard material layer has a glass-like configuration. The surface is correspondingly very low-friction with a high hardness level and resisting power.

The hard material layer can be present in a stoichiometric transition stage. Meant by this is that, e.g., the carbon or silicon portion is present in a nanoscale disperse phase, meaning it is finely distributed on a limited scale.

The hard material layer is applied using a PVD method, particularly preferably in a plasma PVD process. So-called CVD-like process support results hereby, because the non-metal materials carbon, nitrogen and silicon are, to a certain degree, involved during the PVD process in chemical reactions that turn a purely PVD process into a PVD process with elements of the CVD processes.

As already addressed, the achievable crystal structures are essentially based on the selected material combinations. In addition, the resulting crystal structures can, however, also be influenced to a certain degree by the process control. The coating system 1 (FIG. 1) is therefore constructed in such a way that the process control supports the formation of different crystal structures. For this, at least one target 2, the components that are to be coated, i.e., the pins 4, and optionally a cooling device 5 are provided in the coating chamber 3. Not shown is a transport device for the pins 4 that transports these through the coating chamber 3. The transport takes place through the process chamber 3 in the through-feed method (indicated by means of the arrows 15). The pins 4 thereby preferably rotate around their longitudinal axis 16.

During the PVD process, materials are released from the target 2 that move in a particle flow 6 in the direction of the pins 4 and that deposit on the surface of said pins 4. As a rule, particle deposition takes place only on the surface of the pins that is facing the target. In order to achieve a uniform coating of the pins 4, these are therefore fed in a rotating manner through the coating chamber 3, which is indicated by the arrows 7. The entire surface of the pins 4 is correspondingly exposed to the particle flow 6, so that uniform deposition is achieved. If desired, the pins can also be covered in areas or otherwise withdrawn from the particle flow, so that a hard material coating results only on the desired surfaces.

All PVD methods have in common the fact that a certain heat or heating of the target is necessary in order to generate a particle flow 6. The heat or high temperature is necessary thereby in order to achieve a sufficiently high particle energy that brings about a release of the particles from the target. The sides 8 of the pins 4 facing the target 2 are correspondingly exposed to a higher temperature than the sides 9 of the pins facing away from the target. The sides 8 and 9 can correspondingly also be called the day side 8 and the night side 9. As a result, it follows that the day sides 8 of the pins 4 have a higher temperature than the night sides 9, which in turn influences the achievable crystal structures. The temperature is indicated in the figures by means of schematised thermometers for a high temperature 14 and a low temperature 15.

Figure 3:
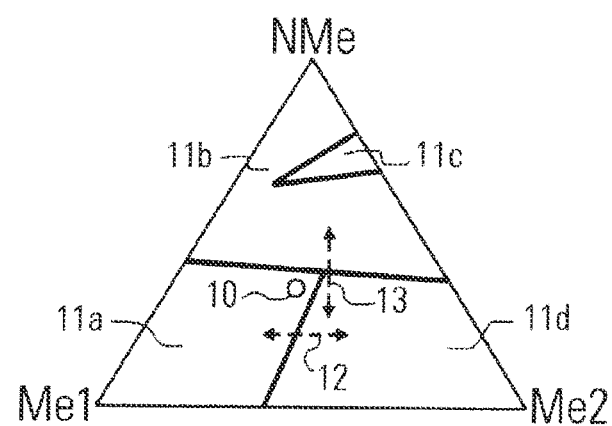

As shown in FIG. 3, so-called ternary phase diagrams apply to material combinations with three materials. In the shown example, the three materials are a non-metal (NMe), a first metal (Me1) and a second metal (Me2). Different crystal structures thereby result depending on the proportions and on the associated process conditions, particularly the temperature. The ternary phase diagram of FIG. 3 is used here only to depict the principle and does not refer to the previously mentioned material combinations.

In the phase diagram of FIG. 3, a plurality of areas 11a, 11b, 11c, 11d are designated, each of which marks different crystallisation structures. In the shown example, the stoichiometric point 10 of a layer or material combination is located close to the boundary between area 11a and the areas 11b and 11d.

The stoichiometric point 10 can normally be changed only comparatively slowly, for which reason other process parameters, such as, e.g., the temperature, present themselves for influencing the hard material layer. By changing the reaction or process conditions on the moved part, it is therefore possible to shift the phase boundaries between the areas 11a, 11b, 11c and 11d in such a way that the phase boundaries shift beyond the stoichiometric point 10. The shifting of the phase boundaries between the areas 11a, 11b, 11c, 11d is indicated in FIG. 3 with the arrows 12 and 13. As already addressed, crystal structures often form in dependence on the energy supply, i.e., the temperature. Consequently, if, e.g., a layer is deposited that is composed of cubic $MoN_{1-x}$ and $CrN_{1-y}$, the cubic $MoN_{1-x}$ can, by means of a temperature change, change to hexagonal $MoN_{1-x}$ whereby the $CrN_{1-y}$ phase remains stable. In principle, one or two individual phases of a layer can change, meaning one or two phase boundaries can shift.

The reaction conditions that need to be changed for this depend on the selected material combinations and can therefore not be described here in general terms. Possible influential measures are, however, a change in the temperature or in the proportions.

In addition, the change to the other side of the phase boundary can also still be forced by means of the shifting of the stoichiometric point, for example, by varying the supply of the reactive gas, i.e., of the non-metal.

The shown coating system 1 has a cooling device 5 for influencing the temperature of the pins 4 in the coating area. During the rotation of the pins 4, an area of the surface lands in the so-called night area 9, where said surface cools.

A different crystal structure correspondingly results in the case of the selection of the respective material combination and the associated temperatures. The cooling can therefore be adapted in such a way that the desired end-point between two crystal structures is always reached. Depending on the selected material combinations, it is also possible that no additional cooling is necessary and the slightly lower temperature due to the greater distance of the night area from the heated target is alone sufficient. However, steep temperature gradients, i.e., a swift and significant change in temperature, are preferred.

During the coating process, a point on the surface of the pin wanders from the night side so to speak through a twilight zone and into the day side and then back to a twilight side and into the night side. The surface of the pin correspondingly begins to heat up from the time of the transition into the twilight zone until it reaches a maximum value in the day side and it begins to cool off again during the transition into the twilight zone. The temperature of the pin surface is therefore subject to constant change, for which reason the hard material layer deposited on it can form different structures.

For such coatings, a base material of Cr-alloy steel, e.g., 59CrV4, 100Cr6 or higher alloyed, is particularly suitable. The coating temperatures preferably lie in the range from 100° C. to 500° C., whereby there is an endeavour to reach a layer thickness of from 1 to 10 µm. Individual sub-layer thicknesses can be less than 0.5 µm. The gradated particle sizes can be 50 nm or less.

In the event that nitrogen and silicon are used as non-metal partners, a hardness level in the range from 2000 to 4000 HV can be achieved. In the event that carbon is used as the non-metal partner, 2000 to 4000 HV can likewise be achieved, whereby values from 4000 to 7000 HV can also be achieved.

In summary, it can be said that the one-sided arrangement of the coating source toward the products and the cooling of the products from the other side and the rotation of the pins allows swift heating and cooling processes at the pin surface. A virtual observation point on the pin surface wanders from the hottest disposition directly opposite the source (i.e., the target) in the direction of the coating horizon, where the energy application is already significantly less, back into the night area, where a cooling process starts that is caused either by active cooling with a cooling device or by the lower ambient temperatures. With the end of the night area, the reheating starts from the dawn horizon. This allows faster changes in the working point in the ternary phase environment and in the ternary phase environment itself. The change speed can be selected via the process.

The presented hard material layer and the method for applying the same can be applied to all types of chains. In particular, bush chains and other types of chains, such as, e.g., toothed chains, can be equipped with it.

The invention claimed is:

1. A link chain made of chain links that are connected to one another by means of chain joints, whereby a chain joint comprises at least one chain joint bearing and a pin that is guided in the chain joint bearing in such a manner that it can pivot and that is in contact with this chain joint bearing,
wherein at least one bearing surface of the pin and/or of the chain joint bearing is provided with a hard material layer and the hard material layer is applied by means of a PVD process,
wherein the hard material layer is formed from a compound that comprises at least a first and a second metal and a non-metal, wherein selected as the non-metal is at least one of the materials C, N or Si and the first metal and the second metal are selected from the materials Cr, Mo, V, W, Ti, Cu, Zn, Zr, Ta, Nb, Al, B, Hf,
wherein the first and the second metal differ from each other,
and the first metal is present in the hard material layer in a crystal structure that differs from the crystal structure of the second metal.

2. The link chain according to claim 1 wherein one of the non-metals C, N or Si is the significant reactant.

3. The link chain according to claim 1, wherein the hard material layer has a gradated configuration with regard to the non-metal portion, the hardness or an internal stress portion.

4. The link chain according to claim 1, wherein a Cr-alloy steel, e.g., 59CrV4 or 100Cr6, is selected as a base material for the pin or for the chain joint bearing.

5. The link chain according to claim 1, wherein the layer thickness of the hard material layer amounts to 1 to 15 micrometers, preferably 1 to 10 micrometers.

6. The link chain according to claim 1, wherein the hard material layer includes a sub-layer, a thickness of the sublayer being less than 1 µm, preferably less than 0.5 µm.

7. The link chain according to claim 1, wherein the gradated particle sizes of the hard material layer have a size of less than or equal to 100 nm, preferably of less than or equal to 50 nm.

8. The link chain according to claim 1, wherein the hard material layer has a glass-like structure at least in areas.

9. The link chain according to claim 1, wherein the gradated layer hardness levels of the hard material layer are from 2000 to 4000 HV or 4000 to 7000 HV.

10. The link chain according to claim 1, wherein the hard material layer is applied by means of a continuous PVD method using a through-feed method.

11. A chain pin for a link chain wherein the chain pin is provided at least in areas with a hard material layer according to claim 1.

12. A method for coating with a hard material layer a bearing surface of a pin and/or of a chain joint bearing for a chain, wherein the hard material layer is applied by means of a PVD process and is formed from a compound that comprises at least a first and a second metal and a non-metal, wherein at least one of the materials C, N or Si is selected as the non-metal and the first metal and second metal are selected from the materials Cr, Mo, W, Ti, Cu, Zn, Zr, Ta, Nb, Al, B, V, Hf, wherein the first metal and the second metal differ from each other,
and the first metal is present in the hard material layer in a crystal structure that differs from the crystal structure of the second metal.

13. The method for coating with a hard material layer a bearing surface of a pin and/or of a chain joint bearing for a chain according to claim 12, wherein the hard material layer is applied in a gradated configuration.

14. The method for coating with a hard material layer a bearing surface of a pin and/or of a chain joint bearing for a chain according to claim 12, wherein the PVD process runs as a continuous process using the through-feed method.

15. The method for coating with a hard material layer a bearing surface of a pin and/or of a chain joint bearing for a chain according to claim 12, wherein the components to be coated are fed during the coating process in a coating area in such a manner that the components that are to be coated are exposed at least in areas to different temperatures over time.

16. The method for coating with a hard material layer a bearing surface of a pin and/or of a chain joint bearing for a chain according to claim 12, wherein the first metal is selected from a first group and the second metal is selected from a second group, wherein at least one metal of the first group is combined with at least one metal of the second group, and the first group includes Cr, Mo, V, W, Ti and the second group includes Cu, Zn, Zr, Ta, Nb, Al, B, Hf.

* * * * *